US006932872B2

(12) United States Patent
Hamaguchi

(10) Patent No.: US 6,932,872 B2
(45) Date of Patent: Aug. 23, 2005

(54) HEATING APPARATUS USING INDUCTION HEATING

(75) Inventor: Maki Hamaguchi, Kobe (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 10/270,522

(22) Filed: Oct. 16, 2002

(65) Prior Publication Data

US 2003/0094451 A1 May 22, 2003

(30) Foreign Application Priority Data

Nov. 16, 2001 (JP) ....................................... 2001-351579

(51) Int. Cl.[7] ............................ C23C 16/00; H05B 6/10

(52) U.S. Cl. ....................... 118/725; 118/728; 219/634; 219/635; 219/649; 219/651

(58) Field of Search ................................ 219/634, 635, 219/647, 649, 651, 652; 118/724, 725, 728, 726

(56) References Cited

U.S. PATENT DOCUMENTS

| | | | | | |
|---|---|---|---|---|---|
| 4,545,327 | A | * | 10/1985 | Campbell et al. | 118/719 |
| 4,579,080 | A | * | 4/1986 | Martin et al. | 118/500 |
| 4,745,088 | A | | 5/1988 | Inoue et al. | |
| 4,794,220 | A | * | 12/1988 | Sekiya | 219/634 |
| 5,268,327 | A | * | 12/1993 | Vernon | 437/126 |
| 6,062,851 | A | * | 5/2000 | Rudolph et al. | 432/250 |
| 2002/0017242 | A1 | * | 2/2002 | Hamaguchi et al. | 118/715 |

FOREIGN PATENT DOCUMENTS

| | | | | |
|---|---|---|---|---|
| JP | 64-82518 | * | 12/1989 | 118/730 |
| JP | 3-22429 | * | 1/1991 | 118/728 |
| JP | 4-101385 | * | 4/1992 | 219/649 |
| JP | 7-58029 | | 3/1995 | |
| JP | 7-263366 | * | 10/1995 | |
| JP | 7-278799 | * | 10/1995 | |
| JP | 8-181150 | | 7/1996 | |
| JP | 2002-21890 | | 1/2000 | |
| JP | 2002-151237 | | 5/2002 | |
| KR | 94-9995 | | 10/1994 | |

OTHER PUBLICATIONS

J. H. Fisher, et al. "A New Process for the Production of Long Glassy Polymeric Carbon Hollow Ware With Uniform Wall Thickness Using a Spray Technique" Carbon vol. 34, No. 6, 1996, pp. 789–795.

* cited by examiner

*Primary Examiner*—Philip H. Leung
(74) *Attorney, Agent, or Firm*—Oblon, Spivak, McClelland, Maier & Neustadt, P.C.

(57) ABSTRACT

A heating apparatus which is installed in a low pressure CVD system or annealing equipment for use in semiconductor integrated circuit manufacturing processes for heat-treating wafers on which IC's are to be formed, wherein wafers are uniformly heated, the temperature of wafers is rapidly raised and lowered, and wafers are processed in high volume, wherein the apparatus comprises a cylindrical body made of glass-like carbon placed inside a reactor, and a high-frequency induction coil which is placed outside the reactor and is for causing the cylindrical body made of glass-like carbon to produce heat and thereby heating wafers in the reactor.

3 Claims, 2 Drawing Sheets

FIG. 1
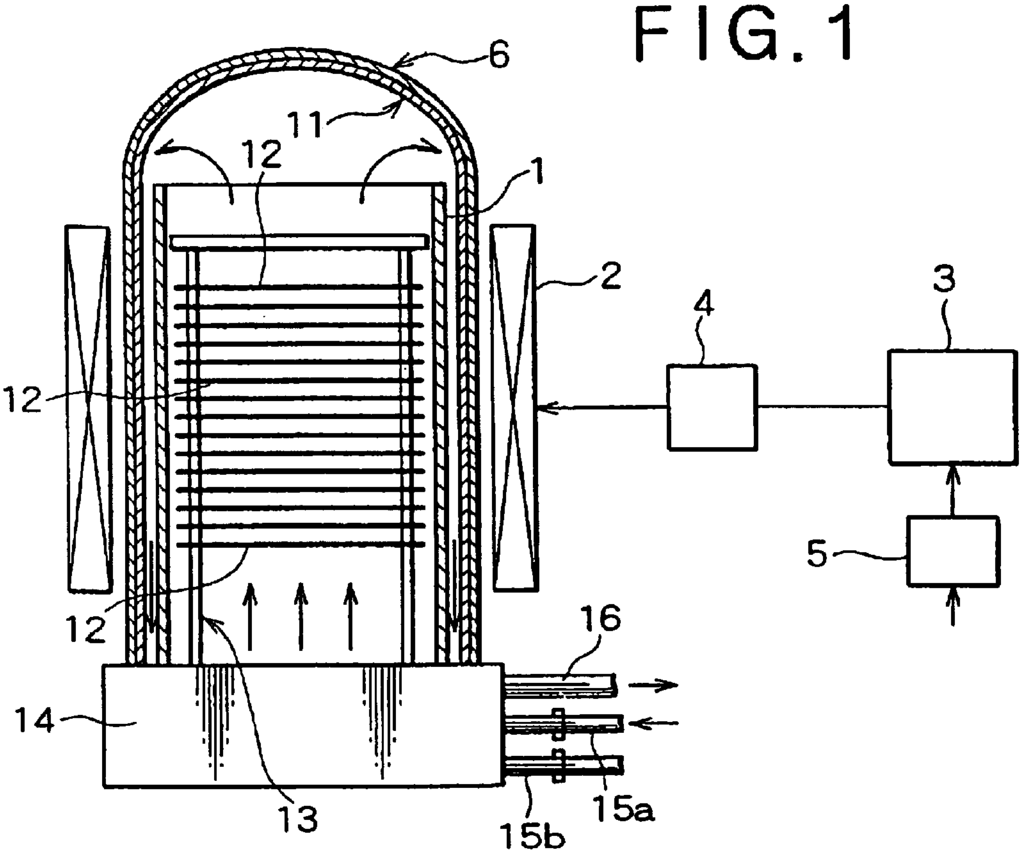
FIG. 2 *PRIOR ART*
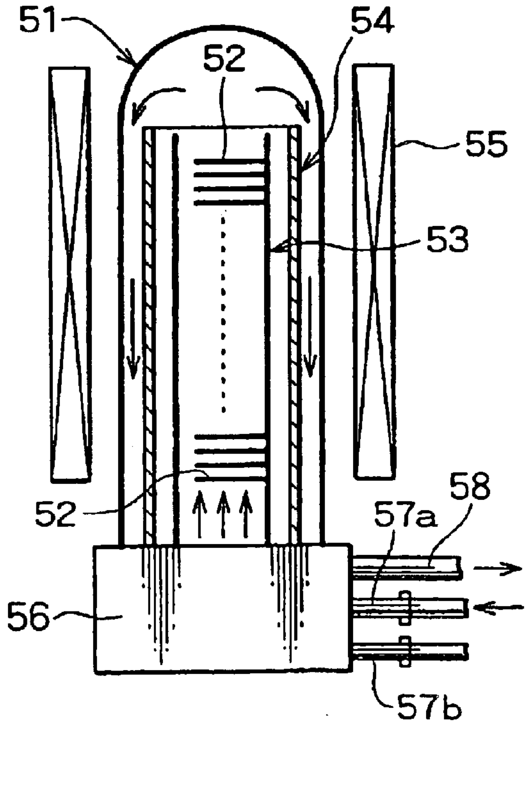

HEATING APPARATUS USING INDUCTION HEATING

BACKGROUND OF THE INVENTION

1. Field of the Invention

This invention relates to a heating apparatus which is installed in, for example, a low pressure CVD system and is suitable for heat treatment on wafers.

2. Description of Related Art

As is commonly known, a semiconductor integrated circuit manufacturing process involves a variety of IC process units, including oxidation and dispersion equipment, vapor phase epitaxial growth systems, low pressure CVD systems (LPCVD systems), and annealing equipment. These units are equipped with heating apparatuses for heat-treating silicon wafers (hereafter, simply referred to as "wafers") on which IC's are being formed or to be formed.

FIG. 2 is a schematic diagram illustrating an example of vertical low pressure CVD systems equipped with a heater based on electric resistance heating as heating apparatus, for the purpose of explanation of prior arts. In low pressure CVD, films are generally formed at temperature of 400 to 800° C. under pressure of 0.1 to 30 Torr (approx. 0.013 kPa to 4.0 kPa).

As shown in FIG. 2, the batch processing vertical low pressure CVD system is provided with a reactor 51 made of quartz having circular hollow cross-sections and dome-shaped top; a cylindrical inner tube 54 made of quartz placed inside the reactor 51; a boat 53 which is placed inside the inner tube 54 and is mounted with a large number (for example, 100 to 150 or so) of vertically arranged wafers 52; and a manifold 56. The vertical low pressure CVD system is further provided with a cylindrical heater 55 concentrically placed around the reactor 51 so that the reactor is encircled with the heater in the case of this example. The reactor 51, the inner tube 54, the boat 53, and the heater 55 are arranged with the axis common thereto. On the manifold 56, the reactor 51 and the inner tube 54 are placed, and further, the boat 53 is placed with a pedestal (not shown) in-between. The manifold 56 is provided with gas injectors 57*a* and 57*b* for feeding source gas or the like into the inner tube 54 and with a gas exhaust port 58 for letting out reacted gas or unreacted gas from the reactor 51.

An explanation is given below about a case where, for example, a polysilicon film is formed on wafers 52 using the vertical low pressure CVD system provided with the heater 55 based on electric resistance heating. First, wafers 52 are set on the boat 53, and the boat 53 is inserted into the inner tube 54 from an opening (not shown) located at the lower end of the manifold 56, together with the pedestal (not shown) with the boat 53 placed thereon. The opening in the manifold 56 is closed with a hatch (not shown). Then the space inside the inner tube 54 is heated to a specified temperature by means of the heater 55 based on electric resistance heating, and further, silane gas is fed into the inner tube 54 through the gas injector 57*a*. The silane gas is heated and pyrolytically decomposed on the surfaces of the wafers 52, and a polysilicon film is thereby formed on the surfaces of the wafers 52. The reacted gas or unreacted gas goes through the path between the inner tube 54 and the reactor 51 and externally discharged from the gas exhaust port 58. As mentioned above, to form films on wafers in the vertical low pressure CVD system, the heater 55 based on electric resistance heating is used as heating apparatus for heat-treating the wafers 52.

FIG. 3 is a schematic diagram illustrating an example of single wafer processing vapor phase epitaxial growth systems equipped with infrared lamps as heating apparatus, for the purpose of explanation of prior arts. The details of the vapor phase epitaxial growth of silicon vary depending on source gas used (four varieties of gases: silicon tetrachloride gas, silane dichloride gas, silane trichloride gas, and silane gas), but in general the reaction occurs at a temperature of 1100 to 1200° C. or so.

As shown in FIG. 3, a disk-like susceptor designed to support a wafer 62 placed thereon one by one is placed in a reactor 61 made of quartz. The surface of the susceptor 63 is made of a graphite base material coated with silicon carbide. A plurality of infrared lamps 64 as heating apparatus is placed concentrically with the reactor 61 outside the reactor. In the upper space 61*a* in the reactor 61, source gas (including dopant), fed in through a gas feed port 65 together with hydrogen gas as carrier gas, moves in substantially laminar flow over the surface of the wafer 62, and is discharged from an exhaust port 66 located on the opposite side. In the lower space 61*b* in the reactor 61, hydrogen gas as purge gas is fed under a higher pressure than that of the source gas (reactive gas). In this vapor phase epitaxial growth system, a wafer 62 placed in the reactor 61 is radiantly heated to a specified temperature through the reactor 61 by means of infrared lamps 64 located above and beneath the reactor 61, and thus a silicon epitaxial layer is formed by vapor phase growth. As mentioned above, to form a silicon epitaxial layer in this vapor phase epitaxial growth system by vapor phase growth, infrared lamps 64 are used as heating apparatus for heat-treating the wafer 62.

FIG. 4 is a schematic diagram illustrating an example of single wafer processing vapor phase epitaxial growth system equipped with a high-frequency induction coil as heating apparatus, for the purpose of explanation of prior arts.

As shown in FIG. 4, a disk-like susceptor 73 made of graphite on which a wafer 72 is to be placed one by one is placed in a reactor 71 made of quartz. A high-frequency induction coil 74 for causing the susceptor 7 with a wafer 72 supported thereon to produce heat and thereby heating the wafer 72 is installed under the susceptor 73 outside the reactor 71. The high-frequency induction coil 74 and the susceptor 73 form a heating apparatus for heating a wafer 72. In the reactor 71, source gas (reactive gas) or the like is fed through a gas feed port 75. The gas or the like moves in substantially laminar flow over the surface of the wafer 72, and is discharged from an exhaust port 76 located on the opposite side. In this vapor phase epitaxial growth system, a wafer 72 is heated to a specified temperature by causing the susceptor 73 to produce heat via the high-frequency induction coil 74, and a silicon epitaxial layer is formed by vapor phase growth. As mentioned above, to form a silicon epitaxial layer in this vapor phase epitaxial growth system by vapor phase growth, the high-frequency induction coil 74 and the susceptor 73 made of graphite are used as heating apparatus for heat-treating a wafer 72.

However, in the above-mentioned heating apparatuses wherein heating is provided by radiant heat or conductive heat from a heater, there is restriction due to thermal conduction between the output of the heater and wafers as objects to be heated. As shown in Table 1, therefore, these apparatuses are theoretically unsuitable for rapidly raising or lowering the temperature. Thus, these apparatuses have a disadvantage that it takes much time to rise and lower the temperature of wafers and this leads to impaired throughput.

TABLE 1

| | Required Characteristics | | |
|---|---|---|---|
| Conventional Apparatuses | High-volume processing | Temperature uniformity | Rapid temperature rise/drop |
| Heater | ○ | ○ | Δ |
| Lamp | X | ○ | ⊚ |
| High-frequency induction coil | X | ○ | ⊚ |

⊚: Excellent
Δ: Considerably restricted
○: Medium
X: Unsuitable

In the above-mentioned heating apparatuses wherein radiant heating is implemented by infrared lamps, the performance greatly depends on the distance between the lamps and wafers as objects to be heated. Therefore, tens of lamps are required for several wafers. As shown in Table 1, these apparatuses have a disadvantage that the apparatuses are incapable of processing wafers in high volume. In the above-mentioned heating apparatuses wherein heating is implemented by a high-frequency induction coil, the susceptor caused to produce heat to heat wafers is formed in disk shape, and such apparatuses are so designed that wafers are placed on the disk-shaped susceptor. Therefore, these apparatuses have a disadvantage that they are incapable of processing wafers in high volume.

SUMMARY OF THE INVENTION

To cope with these disadvantages, this invention is intended to provide a heating apparatus which is installed in a low pressure CVD system or annealing equipment for use in semiconductor integrated circuit manufacturing processes for heat-treating wafers on which IC's are to be formed, wherein wafers are uniformly heated, the temperature of wafers is rapidly raised or lowered, and wafers are processed in high volume.

To attain the purpose, first aspect of the invention is directed to a heating apparatus comprising a cylindrical body made of glass-like carbon placed in a reactor; and a high-frequency induction coil that is placed outside the reactor and is for causing the cylindrical body made of glass-like carbon to produce heat and thereby heating objects to be heated in the reactor.

Second aspect of the invention is directed to the heating apparatus according to first aspect wherein a heat insulating body is placed between the cylindrical body made of glass-like carbon and the high-frequency induction coil or around the high-frequency induction coil.

The heating apparatus of the invention is a heating apparatus utilizing high-frequency induction heating, and is provided with the cylindrical body made of glass-like carbon placed inside the reactor and the high-frequency induction coil placed outside the reactor. The heating apparatus is so designed that alternating-current, high-frequency power is supplied to the high-frequency induction coil to cause the cylindrical body made of glass-like carbon with wafers, or objects to be heated, housed, for example, therein to produce heat, and the wafers are thereby heat-treated.

The heating apparatus of the invention is provided with the cylindrical body made of glass-like carbon as heating element. Glass-like carbon (GLC) is obtained by curing thermosetting resin as raw material and carbonizing the material in an inert atmosphere or in vacuum. Like ordinary carbon materials, glass-like carbon has such properties as lightness in weight, heat resistance, corrosion resistance, and electrical conductivity. In addition, glass-like carbon has such advantages as high purity, high strength (mirror-polishable), gas impermeability, and low particle and gas emission capability. On this account, the cylindrical body made of glass-like carbon placed in the reactor does not emit impurity particles or gas, and absorbs less gas and is chemically stable. Therefore, wafers are prevented from being contaminated even under high-temperature, corrosive reaction conditions. While glass-like carbon has an amorphous, uniform, continuous, and dense texture, graphite materials have a structure comprising aggregates of carbon powder particles. For this reason, graphite materials pose problems, such as the production of carbon powder and emission of occluded gas during reaction.

Since the cylindrical body made of glass-like carbon is caused to produce heat by electrical currents produced by high-frequency induction, the cylindrical body is capable of rapidly raising the temperature. Meanwhile, since the cylindrical body is made of glass-like carbon having a property of low thermal capacity, the cylindrical body is capable of rapidly lowering the temperature. Further, since the cylindrical body is made of glass-like carbon that has an amorphous, uniform, continuous, and dense texture and is excellent in thermal conductivity, the cylindrical body made of glass-like carbon is excellent in temperature uniformity. Further, the cylindrical body made of glass-like carbon can be fabricated in such size that batch processing, in which a large number of wafers are processed at a time, can be implemented. As mentioned above, the heating apparatus of the invention can be installed in low pressure CVD systems, annealing equipment, and the like for use in semiconductor integrated circuit manufacturing processes, and is capable of uniformly heating wafers and rapidly raising and lowering the temperature of wafers as well as processing wafers in high volume.

In the heating apparatus with a heat insulating body placed between the cylindrical body made of glass-like carbon and the high-frequency induction coil or around the high-frequency induction coil, the quantity of heat escaping from the cylindrical body made of glass-like carbon to the outside of the reactor can be reduced, and this contributes to the enhancement of heating efficiency (heat utilization).

As mentioned above, the heating apparatus of the invention comprises the cylindrical body made of glass-like carbon placed inside a reactor and the high-frequency induction coil that is placed outside the reactor and is for causing the cylindrical body made of glass-like carbon to produce heat and thereby heating objects to be heated in the reactor. Therefore, when the heating apparatus of the invention is installed in a low pressure CVD system or annealing equipment for use in semiconductor integrated circuit manufacturing processes for heat-treating wafers on which IC's are to be formed, the wafers are uniformly heated, the temperature of wafers is rapidly raised and lowered, and further, wafers are processed in high volume, which is not the case with systems using a conventional heating apparatus based on high-frequency induction heating. Thus, furnishing a low pressure CVD system or annealing equipment with the heating apparatus of the invention significantly shortens time required for high-volume processing of wafers and enhances the productivity, as compared with cases where a conventional electrical resistance heater is used. With the heating apparatus of the invention provided with the heat insulating body, the quantity of heat escaping from the cylindrical body made of glass-like carbon to the outside of the reactor is reduced, and this contributes to the enhancement of heating efficiency (heat utilization).

Other and further objects, features and advantages of the invention will appear more fully from the following description.

BRIEF DESCRIPTION OF THE DRAWINGS

FIG. 1 is a schematic diagram illustrating an example of vertical low pressure CVD systems equipped with the heating apparatus of the invention.

FIG. 2 is a schematic diagram illustrating an example of vertical low pressure CVD systems equipped with a heater based on electric resistance heating as heating apparatus, for the purpose of explanation of prior arts.

DETAILED DESCRIPTION OF THE PREFERRED EMBODIMENTS

Figure 3:
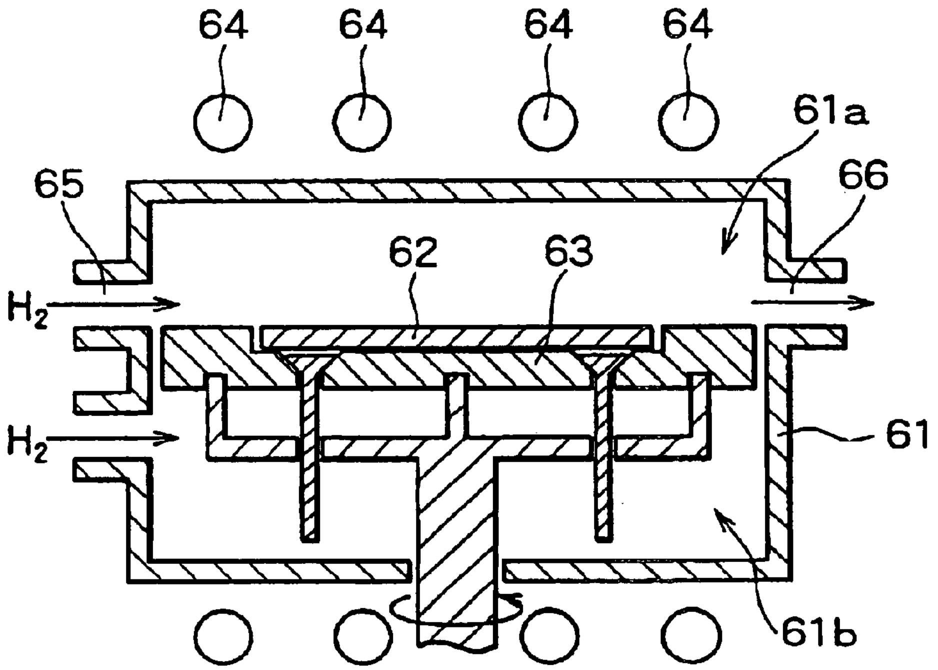
FIG. 3 PRIOR ART
FIG. 3 is a schematic diagram illustrating an example of single wafer processing vapor phase epitaxial growth systems equipped with infrared lamps as heating apparatus, for the purpose of explanation of prior arts.
Figure 4:
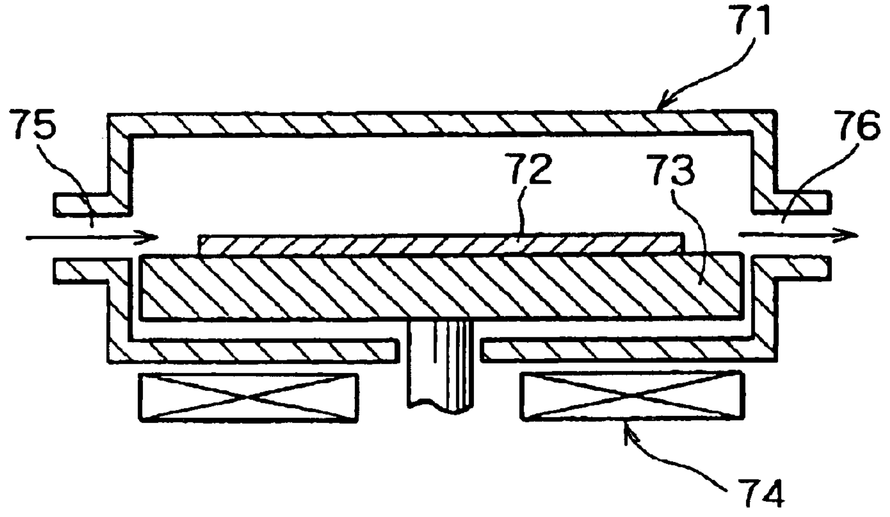
FIG. 4 PRIOR ART
FIG. 4 is a schematic diagram illustrating an example of single wafer processing vapor phase epitaxial growth systems provided with a high-frequency induction coil as heating apparatus, for the purpose of explanation of prior arts.

An explanation is given below about an embodiment of the invention, referring to the accompanying drawing. FIG. 1 is a schematic diagram illustrating an example of vertical low pressure CVD systems equipped with the heating apparatus of the invention.

As shown in FIG. 1, this batch processing vertical low pressure CVD system is provided with a reactor 11 made of quartz having circular hollow cross-sections and dome-shaped, closed top; a cylindrical body 1 made of glass-like carbon which is placed in the reactor 11 and is an inner tube formed in cylindrical shape; a boat 13 which is placed inside the cylindrical body 1 made of glass-like carbon and is designed to be mounted with a large number of vertically arranged wafers 12; and a manifold 14. The vertical low pressure CVD system is further provided with a heat insulating body 6 made of carbon fiber felt covering the reactor 11; an air-core-type, high-frequency induction coil 2 placed concentrically with the reactor 11 covered with the heat insulating body 6 outside the reactor; a high-frequency, alternating-current power supply 3 which supplies alternating-current, high-frequency power to the high-frequency induction coil 2 through a matching device 4; and a controller 5. The controller 5 uses a thermocouple (not shown) as sensor in the case of this example to detect the temperature in the reactor 11, and feeds the detected value back to the output of the high-frequency, alternating-current power supply 3 to control the temperature.

The reactor 11, the cylindrical body 1 made of glass-like carbon, the boat 13, and the high-frequency induction coil 2 are arranged with the axis common thereto. On the manifold 14, the reactor 11 and the cylindrical body 1 made of glass-like carbon are placed, and further, the boat 13 is placed with a pedestal (not shown) in-between. The manifold 14 is provided with gas injectors 15*a* and 15*b* for feeding source gas or the like into the cylindrical body 1 made of glass-like carbon and with a gas exhaust port 16 for letting out reacted gas or unreacted gas from the reactor 11.

The cylindrical body 1 made of glass-like carbon, the high-frequency induction coil 2, the high-frequency, alternating-current power supply 3, the matching device 4, the controller 5, and the heat insulating body 6 form the heating apparatus installed in this vertical low pressure CVD system. The cylindrical body 1 made of glass-like carbon can be fabricated using thermosetting resin, for example, phenolic resin as raw material by a publicly known method. A resin molding as a precursor of the cylindrical body 1 made of glass-like carbon is preferably formed by centrifugal molding. The resin molding is carbonized at a temperature not less than 1000° C., preferably a temperature not less than 1500° C. and thereby converted to the cylindrical body 1 made of glass-like carbon. The cylindrical body is then machined to a specified length, inside diameter, and/or outside diameter as required.

Then an explanation is given below about a case where, for example, a polysilicon film is formed on wafers 12 using this vertical low pressure CVD system. First, the wafers 12 are set on the boat 13, and the boat 13 is inserted into the cylindrical body 1 made of glass-like carbon from an opening (not shown) located at the lower end of the manifold 14, together with the pedestal (not shown) with the boat 13 placed thereon. The opening in the manifold 14 is closed with a hatch (not shown). Then an alternating, high-frequency current is passed through the high-frequency induction coil 2 to cause the cylindrical body 1 made of glass-like carbon to produce heat. Thereby the space in the cylindrical body 1 made of glass-like carbon is heated to a specified temperature, and further, silane gas is fed into the cylindrical body 1 made of glass-like carbon through the gas injector 15*a*. The silane gas is heated and pyrolytically decomposed, and a polysilicon film is consequently formed on the surfaces of the wafers 12. Reacted gas or unreacted gas goes through the path between the cylindrical body 1 made of glass-like carbon and the reactor 11, and is externally discharged from the gas exhaust port 16. When the formation of the polysilicon films completes, power application to the high-frequency induction coil 2 is stopped.

As mentioned above, to form films on the surfaces of wafers 12 in this vertical low pressure CVD system, the heating apparatus is used for heat-treating the wafers 12. The heating apparatus in this embodiment comprises the cylindrical body 1 made of glass-like carbon placed inside the reactor 11 and the high-frequency induction coil 2 is placed outside the reactor 11. The heating apparatus is so designed that alternating-current, high-frequency power is supplied to the high-frequency induction coil 2 to cause the cylindrical body 1 made of glass-like carbon with wafers 12 housed therein to produce heat, and the wafers 12 are thereby heat-treated. Thus the heating apparatus in this embodiment is capable of uniformly heating wafers, rapidly raising and lowering the temperature of wafers, and further, processing wafers in high volume unlike conventional heating apparatuses based on high-frequency induction heating. When a film is formed on wafers using a vertical low pressure CVD system equipped with the heating apparatus in this embodiment, time required for processing the wafers in high volume is shortened as compared with cases where a system provided with an electrical resistance heater is used.

Furnishing a CVD system with the heating apparatus of the invention brings an advantage that the CVD system can be cleaned in situ. An explanation is given about this point. As a CVD (Chemical Vapor Deposition) process is repeated, unwanted films deposit on the component parts, such as an inner tube mentioned above, of the CVD system. When the thickness of the deposited films exceeds a certain limit, particles are formed due to film peeling and the yield of wafers is impaired. To cope with this, the inner tube used is replaced with a new one before this event takes place, and the removed tube is cleaned in chemical, such as hydrofluoric acid. The operation of the system need be interrupted before the replacement of the inner tubes, and after the installation of a new inner tube, idling must be performed to stabilize film formation conditions. A series of these operations reduces uptime and thus degrades productivity. To cope with this, recently, in-situ equipment cleaning (operation of cleaning equipment in situ) has been employed to reduce the downtime of equipment for replacement. In in-situ cleaning, such gas as chlorine trifluoride is fed into the CVD system and reacted with unwanted deposited films to remove the deposited film in gaseous form. However, the conventional inner tubes made of quartz or silicon carbide (SiC) is insufficient in corrosion resistance, and the application of in-situ equipment cleaning is rather limited.

Since the cylindrical body made of glass-like carbon is excellent in corrosion resistance, meanwhile, the cylindrical body is not affected by highly corrosive gas, such as chlorine trifluoride mentioned above. Further, since the cylindrical body made of glass-like carbon itself produces heat unlike the conventional inner tubes, noticeable gas cleaning effect is achieved. As mentioned above, furnishing a CVD system with the heating apparatus of the invention brings an advantage that in-situ equipment cleaning is performed with ease.

Since the heating apparatus in this embodiment is provided with the heat insulating body 6 made of carbon fiber felt covering the reactor 11, the quantity of heat escaping from the cylindrical body 1 made of glass-like carbon to the outside of the reactor 11 can be reduced. If the heat insulating body 6 is not installed, approx. ½ of the quantity of heat produced will escape from the cylindrical body 1 made of glass-like carbon to the outside of the reactor 11. In this embodiment, the heat insulating body 6 is placed between the reactor 11 and the high-frequency induction coil 2, but the heat insulating body may be placed outside the high-frequency induction coil 2 so that the coil 2 and the reactor 11 are encircled with the heat insulating body.

Then the specific result of an experiment is introduced below as an example. The cylindrical body made of glass-like carbon was placed in the reactor made of quartz, and the high-frequency induction coil was placed outside the reactor. While nitrogen gas was passed though the reactor, the cylindrical body made of glass-like carbon was caused to produce heat. The heat insulating body was not installed. In this experiment, the dimensions of the cylindrical body made of glass-like carbon were 2 mm in thickness×60 mm in outside diameter×110 mm in length. The air-core-type, high-frequency induction coil to be water-cooled, 85 mm in inside diameter×4 turns (coil pitch: 10 mm) was fabricated using a water-cooled copper tube, 6 mm in outside diameter. A current was passed through the high-frequency induction coil under the conditions of frequency of 430 kHz, output of 1.2 kW, and current of 6 A. As a result, it only took 3 minutes to raise the temperature of the inner circumferential surface of the cylindrical body made of glass-like carbon in the center in the direction of the length from room temperature to 850° C.

Table 2 illustrates a concrete example of the heating apparatus of the invention installed in, for example, a vertical low pressure CVD system. Use of high-frequency induction heating as detailed in the table realizes a heating apparatus which is applicable to high-volume processing of wafers, unlike the conventional heating apparatuses based on high-frequency induction heating using a heating element made of graphite material.

TABLE 2

| Item | Design Specifications |
|---|---|
| Cylindrical body made of glass-like carbon | Dimensions: 2.5 mm (thickness) × 270 mm (outside diameter) × 1300 mm (length)<br>Specific heat: Approx. 0.16 |
| Heating conditions | Temperature: To be raised from room temperature to 1000° C. in 10 minutes. Thereafter, this temperature is to be maintained.<br>Area to be heated: Substantially whole surface of cylindrical body made of glass-like carbon in above dimensions |
| High-frequency induction coil | Water-cooled copper tube used: 20 mm<br>Dimensions: 350 mm (inside diameter) × 1100 mm (number of turns: 50 turns) |
| High-frequency power supply | Output: 50 kW<br>Frequency: 30 kHz to 100 kHz |

With respect to the heating apparatus of the invention, its cylindrical body made of glass-like carbon is in cylindrical shape, and the heating apparatus is of course usefully applicable to heat treatment on cylindrical objects to be heated, such as cylindrical substrates of photoconductor drums.

The foregoing invention has been described in terms of preferred embodiments. However, those skilled, in the art will recognize that many variations of such embodiments exist. Such variations are intended to be within the scope of the present invention and the appended claims.

What is claimed is:

1. A CVD system comprising:

a reactor formed as a tube;

a wafer boat positioned in the reactor;

a cylindrical body positioned in the reactor surrounding the wafer boat and made of glass-like carbon, wherein the upper end of said cylindrical body is open;

means for supplying a gas to the inside of said cylindrical body; and a high frequency induction coil positioned outside the reactor at a location such that energization of the high frequency induction coil will cause at least the cylindrical body made of glass-like carbon to produce heat.

2. The CVD system of claim 1, wherein said wafer boat is made of glass-like carbon.

3. The CVD system of claim 1, further comprising a heat insulating body positioned to insulate said reactor.

* * * * *

UNITED STATES PATENT AND TRADEMARK OFFICE

CERTIFICATE OF CORRECTION

PATENT NO. : 6,932,872 B2
DATED : August 23, 2005
INVENTOR(S) : Hamaguchi

It is certified that error appears in the above-identified patent and that said Letters Patent is hereby corrected as shown below:

Title page,
Item [73], Assignee, should read: -- Kabushiki Kaisha Kobe Seiko Sho (Kobe Steel, Ltd.) Kobe (JP) --.

Signed and Sealed this

Eighteenth Day of October, 2005

JON W. DUDAS
*Director of the United States Patent and Trademark Office*